United States Patent [19]
Yamatake

[11] Patent Number: 5,382,918
[45] Date of Patent: Jan. 17, 1995

[54] CAPACITANCE MULTIPLIER FOR THE INTERNAL FREQUENCY COMPENSATION OF SWITCHING REGULATOR INTEGRATED CIRCUITS

[75] Inventor: Mineo Yamatake, Cupertino, Calif.

[73] Assignee: National Semiconductor Corporation, Santa Clara, Calif.

[21] Appl. No.: 13,508

[22] Filed: Feb. 4, 1993

[51] Int. Cl.⁶ .............................. H03F 3/45
[52] U.S. Cl. ............................ 330/260; 330/293; 330/302
[58] Field of Search ............... 330/103, 260, 293, 292, 330/302, 253, 107, 110, 69; 307/475, 296.8, 490, 494

[56] References Cited

U.S. PATENT DOCUMENTS

| | | | |
|---|---|---|---|
| 3,831,117 | 8/1974 | Fletcher et al. | 330/260 |
| 4,607,243 | 8/1986 | Dreier | 333/214 |
| 5,129,884 | 3/1993 | Kusano | 307/520 |

FOREIGN PATENT DOCUMENTS 0139230 5/1985 European Pat. Off. .

OTHER PUBLICATIONS

Murray, Bipolar op amp with f.e.t. character, Jun. 10, 1980 issue of New Electron.
Sedra and Smith, The 741 Op-Amp Circuit in the second edition of Microelectronic Circuits, 1987 Holt, Rinehart, and Winston Inc. New York pp. 744–747.
Sing, B. P. 'A Novel Circuit for Supercapacitor Simulation', International Journal of Electronics, vol. 52, No. 4, Apr. 1982, London GB, pp. 337–339.

Primary Examiner—James B. Mullins
Assistant Examiner—James Dudek
Attorney, Agent, or Firm—H. Donald Nelson; Brian D. Ogonowsky; Richard J. Roddy

[57] ABSTRACT

A monolithic switching regulator on chip loop frequency compensation circuit is described. An op-amp is provided with a conventional small frequency compensation capacitor, which determines its unity gain frequency and an input resistor. The op-amp incorporates 100% negative feedback. When driven at a frequency that is below its unity gain frequency the noninverting input of the op-amp displays a capacitance having a value on the order of nanofarads, which value would ordinarily require an excessive chip area if fabricated as an actual capacitor. This capacitance value is useful in the on chip loop frequency compensation of a switching regulator where the switching frequency is operated at about 150 kHZ.

6 Claims, 1 Drawing Sheet

CAPACITANCE MULTIPLIER FOR THE INTERNAL FREQUENCY COMPENSATION OF SWITCHING REGULATOR INTEGRATED CIRCUITS

BACKGROUND OF THE INVENTION

Integrated circuit (IC) switching voltage regulators are popular because of their high performance, versatility and economy. The LM1577 is typical of such a voltage regulator. It is designed to operate with a five-volt input and switch at about 52 kHz. It has an adjustment capability which permits the user to control the output voltage. FIG. 1 shows an application of the LM1577 which produces a 12 volt output at up to 800 ma. The circuit functions to maintain the 12-volt output independent of load and input voltage fluctuations.

With reference to FIG. 1, box 10 represents an LM1577. The numbers inside the box represent the pin numbers of a five-pin TO-220 IC package. A +5 volt input is applied to terminal 11 (pin 5) with ground return at terminal 12 (pin 3). A relatively low value (0.1 $\mu$f) capacitor 13 is connected to the input power line to provide input decoupling. An inductor 14, which has a typical value of about 100$\mu$ henries, is coupled between IC pins 5 and 4. A schottky power diode 15 is coupled between the inductor 14 and output terminal 16 at which the regulated output voltage will appear. A large-value filter capacitor (several hundred microfarads) 19 is coupled between output terminal 16 and ground. Resistors 17 and 18 act as a voltage divider across the regulated output at terminal 16 to produce a feedback that is applied to IC pin 2. Resistor 21 and capacitor 20 are coupled between IC pin 1 and ground to provide frequency compensation for the regulator.

In operation, the regulator contains a switch which periodically switches pin 4 to ground. When this switch is closed the current flowing in inductor 14 will ramp up. When this switch opens the switch current will fall to zero and the inductor will generate an inductive kickback in a polarity that adds to the potential at terminal 11. Rectifier 15 will pass the inductive kickback to charge capacitor 19 to a level above that of terminal 5. The boosted voltage on capacitor 19 will be a function of the average voltage at pin 4. Therefore, the charge on capacitor 19 will be a function of the regulator duty cycle. When the potential across capacitor 19 exceeds a value, which produces about 1.3 volts at pin 2, the regulator switch pulse width is reduced. When resistor 18 is 2 k ohms and resistor 17 is 17.4 k ohms, a 12-volt output will be maintained at terminal 16. Thus, the feedback to pin 2 will control the switching pulse width thereby regulating the output voltage even though the input voltage or the load connected to the regulator may vary.

Capacitor 20 is relatively large in terms of IC components. It will typically have a value on the order of nanofarads and must therefore be an off chip component. It would be desirable to incorporate the regulator loop compensation elements entirely within the IC chip.

SUMMARY OF THE INVENTION

It is an object of the invention to incorporate the frequency compensation components of a switching regulator IC on the IC chip.

It is a further object of the invention to create a virtual compensation capacitor in an IC in which a capacitance multiplier produces a large effective capacitance which can serve as a switching regulator frequency compensation element.

It is a still further object of the invention to employ a capacitance multiplying operational amplifier (op-amp) having its own small internal compensation capacitor and to operate the amplifier as a unity gain voltage follower with a low value resistor connected across the non-inverting and inverting inputs whereby the equivalent input capacitance is a multiple of the amplifier small internal compensation capacitance.

These and other objects are achieved as follows. A switching regulator is operated at a relatively high switching frequency and incorporates an error amplifier that requires a relatively large compensation capacitor. An op-amp with its small internal compensation capacitor, has its output connected to its inverting input and includes a first resistor connected across its input terminals. A second resistor couples the non-inverting input of the capacitance multiplying op-amp to the regulator's error amplifier output to add an R and equivalent C frequency compensation to it. The capacitance multiplying op-amp's noninverting input presents an equivalent capacitance inversely proportional to the value of the first resistor multiplied by unity gain frequency of the op-amp. This produces a substantial capacitance as an on chip component and the second resistor provides a series resistor loop compensation component. The equivalent capacitor and the second resistor in series represent the frequency compensating element of the whole switching regulator on the output of the transconductance type error amplifier.

DESCRIPTION OF THE INVENTION

Figure 2:
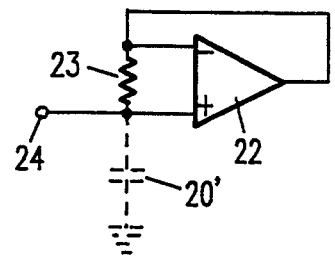
FIG. 2 is an equivalent circuit representation of the circuit of the invention.

FIG. 2 illustrates the basic circuit of the invention. Op-amp 22 has its output coupled back to its inverting input and a resistor 23 is connected between the inverting and noninverting inputs. When such a circuit is driven at terminal 24 by a signal at a frequency that is operating on the −20 db per decade open loop gain slope, the op-amp presents an equivalent capacitance 20' at its noninverting input. The capacitor 20' is shown in dashed outline because it is an effective capacitance, not an actual element. Capacitor 20' will have a value:

$$C_{20'} = 0.159/(R_{23} \times F_O)$$

where $F_O$ is the op-amp unity gain frequency. Thus, the circuit of FIG. 2 can easily simulate a capacitor having a value on the order of several nanofarads. Such a value would otherwise involve inordinate chip area if fabricated as an on-chip capacitance.

Figure 3:
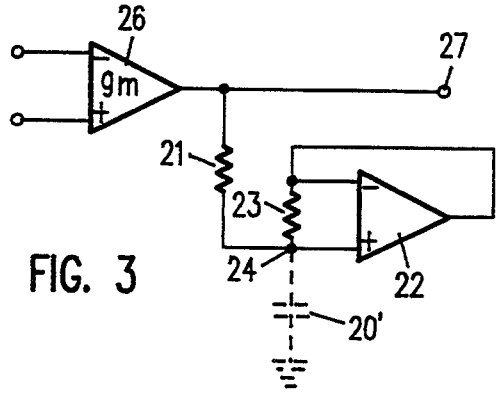
FIG. 3 is a block diagram showing how the circuit of the invention is associated with a switching regulator amplifier.

FIG. 3 shows how the circuit of FIG. 2 is applied as part of the loop compensation to a switching regulator error amplifier 26. Where the circuit elements are the same as those of FIG. 2, the same numerals are employed.

Figure 1:
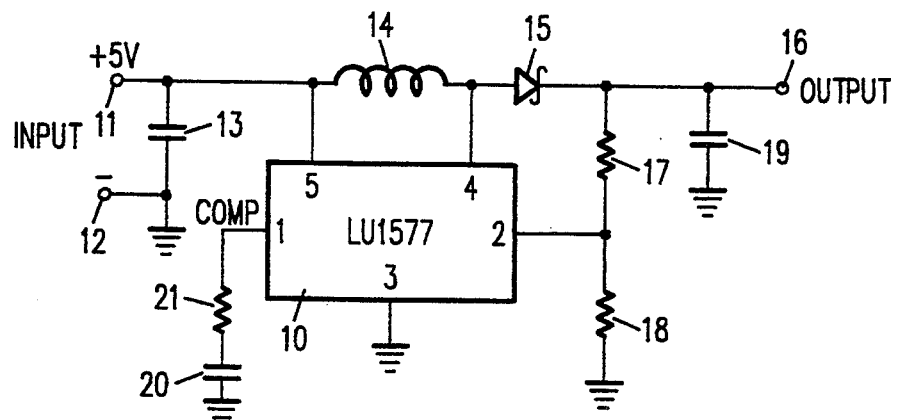
FIG. 1 is a schematic block diagram of a well-known voltage boosting switching voltage regulator.

Error amplifier 26 represents the high gain transconductance amplifier which is part of a switching regulator such as element 10 of FIG. 1. This amplifier is the circuit element that compares the feedback on pin 2 with an internal reference and drives the circuits that control the switch duty cycle. It is to be understood that amplifier 26 has an output at terminal 27 that can be frequency compensated, either by a discrete resistor and capacitor, or by the invention of utilizing an IC resistor and a relatively large equivalent capacitance. As described above, capacitance 20' is presented at terminal 24. This creates the nanofarad-sized capacitor 20 of FIG. 1. Resistor 21 then completes the loop compensation circuit on the output of error amplifier 26. Since the circuit of the invention can be realized, using small area IC components, it is feasible to form the circuit of FIG. 3 as an entirely on-chip structure. This removes the requirement of off-chip compensation components.

Figure 4:
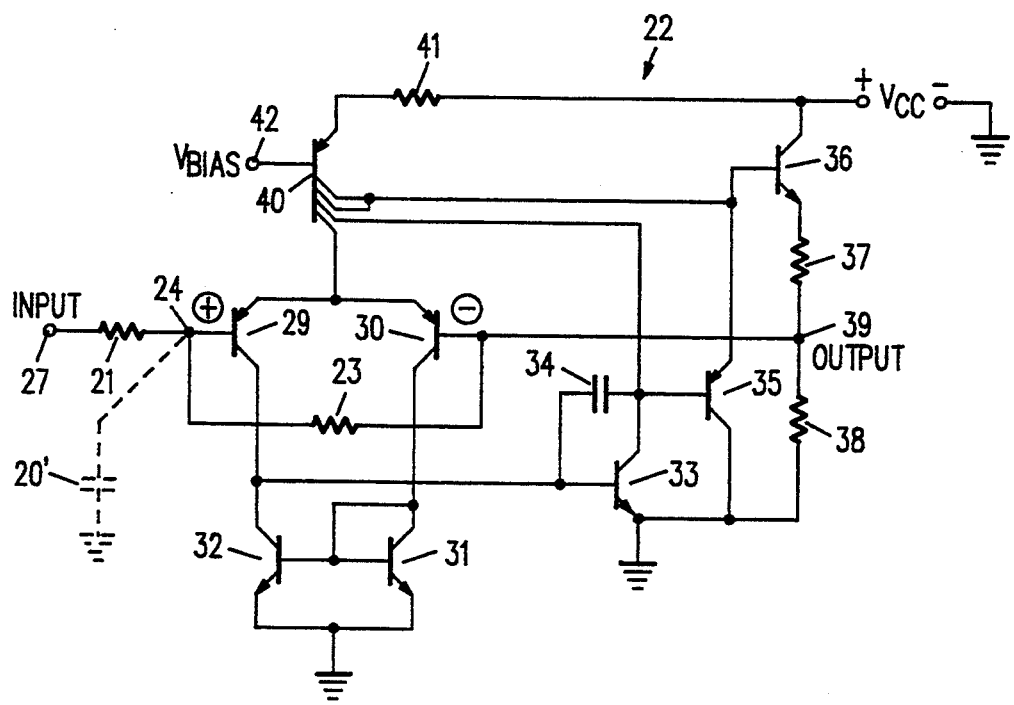
FIG. 4 is a schematic diagram of the circuit of the invention.

FIG. 4 is a schematic diagram showing how op-amp 22, of FIG. 3, can be implemented for an IC chip. This circuit constitutes the preferred embodiment of the invention. The heart of the circuit is a pair of PNP transistors 29 and 30 which respectively form the noninverting and inverting inputs of op-amp 22.

NPN transistors 31 and 32 respectively form the input and output transistors of a conventional current mirror load for the differential input stage. The single ended output of the input stage appears at the collector of transistor 32 which is directly connected to the base of common emitter transistor amplifier 33. Transistor 35 acts an emitter follower isolating buffer which couples the collector of transistor 33 to the base of emitter follower output transistor 36. This isolation ensures very high voltage gain in transistor 33. The op-amp's own small frequency compensation capacitor 34 is connected between the base and collector of transistor 33. This capacitor is needed in the op-amp to ensure the amplifier's unity gain stability. It's typical value is about 20 pf.

Resistors 37 and 38 act in series as the emitter load for output transistor 36. These resistors form a voltage divider so that node 39 forms the output of op-amp 22. This node is directly connected to the inverting input so that 100% negative feedback is present as shown in the block diagrams of FIGS. 2 and 3.

Transistor 40 forms a plural output current source. Its emitter is returned to the $+V_{CC}$ rail by resistor 41. The base of transistor 40 is returned to a $V_{BIAS}$ terminal 42 which is operated at a potential that produces the desired current outputs. Transistor 40 is shown as a four collector device which is typically a lateral PNP transistor having four equal quadrant collectors. Typically, the value of $V_{BIAS}$ is selected to produce one microampere in each of the collectors. Thus, transistor 35 receives two microamperes, transistor 33 receives one microampere and the differential input stage operates at a tail current of one microampere.

EXAMPLE

The circuit of FIG. 4 was constructed in the form of monolithic silicon, planar and PN junction isolated integrated circuit components. The following values were employed:

| COMPONENT | VALUE |
| --- | --- |
| Resistor 21 | 7.5 kohms |
| Resistor 23 | 300 ohms |
| Resistor 37 | 6.2 kohms |

-continued

| COMPONENT | VALUE |
| --- | --- |
| Resistor 38 | 22 kohms |
| Capacitor 34 | 20 pf |

The circuit was operated from a 2.5 volt supply and node 27 was at 0.8 volt. The $V_{BIAS}$ was set for one microampere in each of the transistor 40 collectors. The op-amp had a unity gain frequency of 100 kHz. When driven at 1 kHz, node 24 displayed an equivalent shunt capacitance 20' of about 5.3 nf. This, in combination with resistor 21, can provide an effective loop frequency compensation for IC switching regulators. The entire circuit dissipated less than 0.1 microwatt at a supply potential of 2.5 volts.

The invention has been described and a preferred embodiment detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A capacitance multiplying circuit for use on an integrated circuit chip for providing a relatively large on chip capacitance useful in loop frequency compensation functions, said circuit comprising:

an op-amp having inverting and noninverting inputs, a single ended output and a unity gain frequency;

a first resistor connected between said inverting and noninverting inputs;

means for coupling said op-amp output to its inverting input; and means for driving said op-amp noninverting input at a frequency that is below the op-amp unity gain frequency whereby a relatively large equivalent shunt capacitance is present at said noninverting input.

2. The capacitance multiplying circuit of claim 1 wherein said op-amp further includes a small internal frequency compensation capacitor which determines said op-amp unity gain frequency.

3. The capacitance multiplier of claim 2 wherein said equivalent shunt capacitance is proportional to the reciprocal of said first resistor value multiplied by said unity gain frequency.

4. The capacitance multiplier circuit of claim 2 wherein a second resistor couples said op-amp noninverting input to complete said on chip loop frequency compensation function.

5. A method for providing a large effective capacitance at a non-inverting terminal of an op-amp, said op-amp having a resistance coupled between an inverting terminal of said op-amp and said non-inverting terminal, said method comprising the steps of:

applying an input signal to said non-inverting terminal;

generating an output signal at an output terminal of said op-amp in response to said input signal;

providing said output signal to said inverting terminal; and generating a signal across said resistance in response to said output signal at said input terminal, wherein said signal across said resistance causes an effective shunt capacitance to appear at said non-inverting terminal.

6. The method of claim 5 wherein said equivalent shunt capacitance is inversely proportional to the product of said resistance and a unity gain frequency of said op-amp.

* * * * *